United States Patent [19]

Westbrook

[11] Patent Number: 4,754,459
[45] Date of Patent: Jun. 28, 1988

[54] SEMICONDUCTOR LASERS

[75] Inventor: Leslie D. Westbrook, Ipswich, England

[73] Assignee: British Telecommunications plc, London, England

[21] Appl. No.: 784,949

[22] Filed: Oct. 7, 1985

[30] Foreign Application Priority Data

Sep. 9, 1985 [GB] United Kingdom ............... 8522308

[51] Int. Cl.$^4$ .............................................. H01S 3/19
[52] U.S. Cl. ...................................... 372/32; 372/44; 372/96
[58] Field of Search ...................... 372/96, 44, 29, 32, 372/20, 92

[56] References Cited

PUBLICATIONS

Henning et al, "Measurements of the Linewidth of Ridge-Guide DFB Lasers", Electronics Letters, Oct. 11, 1984, vol. 20, No. 21, pp. 885–887.
Optics Communications, vol. 55, No. 3, Sep. 1, 1985, pp. 174–178, Elsevier Science Publishers B.V., Amsterdam, NL; M. De Labachelerie et al.: "An 850 nm Semiconductor Laser Tunable over a 300 A Range".
Japanese Journal of Applied Physics, vol. 24, No. 7, part 2, Jul. 1985, pp. L519–L521, Tokyo, JP; N. Ogasaware et al.: "Linewidth Enhancement Factor in GaAs-/AlGaAs Multi-Quantum-Well Lasers".
Applied Physics Letters, vol. 42, No. 8, Apr. 15, 1983, pp. 631–622, American Institute of Physics, New York, US; K. Vahala et al.: "On the Linewidth Enhancement Factor Alpha in Semiconductor Injection Lasers".
Journal of Applied Physics, vol. 56, No. 3, Aug. 1, 1984, pp. 670–675, American Institute of Physics, New York, US; J. E. Epler et al.: "High-Energy (7300A) 300 K Operation of Single- and Multiple-Stripe Quantum-Well Heterostructure Laser Diodes in an External Grating Cavity".
IEEE Journal of Quantum Electronics, vol. QE-18, No. 2, Feb. 1982, pp. 259–264, IEEE, New York, US; C. H. Henry: "Theory of the Linewidth of Semiconductor Lasers".
Electronics Letters, vol. 19, No. 22, Oct. 27, 1983, pp. 927–929, Hitchin Herts, GB; I. D. Henning et al.: "Measurements of the Semiconductor Laser Linewidth Broadening Factor".
Electronics Letters, Feb. 3, 1983, vol. 19, No. 3; "10 kHz Linewidth 1.5 μm InGaAsP External Cavity Laser with 55 nm Tuning Range".

Primary Examiner—James W. Davie
Attorney, Agent, or Firm—Nixon & Vanderhye

[57] ABSTRACT

The emission linewidth of a semiconductor laser can be reduced by operating it at a wavelength which is less than the wavelength of maximum gain at the threshold current, λ max. An assembly for carrying out such operation comprises a ridge waveguide laser provided with a distributed feedback (DFB) grating. The period of the grating is selected to give a predetermined emission wavelength to the laser which is shorter than λ max.

7 Claims, 2 Drawing Sheets

SEMICONDUCTOR LASERS

FIELD OF THE INVENTION

The present invention relates to semiconductor lasers and finds application in optical communications, particularly in coherent systems.

BACKGROUND AND SUMMARY OF THE INVENTION

The radiation used in optical communications is not necessarily in the visible region, and the words "optical" and "light" when used in this specification are not to be interpreted as implying any such limitation. Indeed, if silica optical fibres are used as the transmission medium, infra-red radiation is of especial usefulness because the loss minima occur in such fibres at 1.3 $\mu$m and 1.55 $\mu$m approximately.

Semiconductor laser structures include a p-n junction across which current flows (the conventional current from p to n) and an "active layer" in which electrons and holes combine with the production of photons by stimulated emission. The active layer has to relate suitably in band gap and refractive index to the other semiconductor regions of the structure in order to achieve a suitable degree of "confinement" of these processes to the active layer. The layers of material to either side of the active layer and in contact with the opposite faces of the active layer are known as "confinement layers".

A major field of application of semiconductor optical devices is in optical fibre communications systems. Silica optical fibres are produced in recent years have loss minima at 1.3 $\mu$m and 1.55 $\mu$m approximately, the latter minimum being the deeper. Accordingly, there is a special need for devices operating in the range from 1.1 to 1.65 $\mu$m, especially from 1.3 to 1.6 $\mu$m. (These wavelengths, like all the wavelengths herein except where the context indicates otherwise, are in vacuo wavelengths). Semiconductor lasers operating in this region of the infra-red usually comprise regions of indium phosphide and of quaternary materials, indium gallium arsenide phosphides ($In_xGa_{1-x}As_yP_{1-y}$). By suitable choices of x and y it is possible to lattice-match the various regions while varying the band gaps of the materials. (Band gaps can be determined experimentally by, for example, photoluminescence). Additionally, both indium phosphide and the quaternary materials can be doped to be p- or n-type as desired.

Semiconductor lasers comprising regions of gallium aluminium arsenide and gallium arsenide are also used for communications purposes. These operate near to 0.9 $\mu$m.

The photons produced by stimulated emission, when a laser is driven at a current above a threshold current, are caused by the design of the laser to oscillate in a direction along it, in the active layer, before being emitted. During each passage through the material of the active layer the number of photons is increased to a degree determined by the balance between gain and losses in the active layer. The gain shows a peaked spectrum against emission wavelength and there is clearly an advantage in working at the gain peak of the material of the active layer.

In a Fabry-Perot laser, oscillation is caused by at least partially reflecting end-faces of the laser structure, lying at either end of the active layer. In a distributed feedback (DFB) laser, oscillation is caused by corrugations which lie in the region of the active layer, extending generally perpendicular to the length of the laser structure, the corrugations reflecting radiation in each direction along the laser structure.

Structures external to the laser can also contribute to oscillation by reflecting radiation back into the laser. Such structures include external cavities and distributed Bragg reflectors (DBR). External cavities may for instance comprise a mirror placed at a preselected distance along the emission axis. Alternatively radiation may be reflected back into the laser by means of corrugations, similar to those of a DFB laser but shifted to a position outside the laser, adjacent to the emission axis. Lasers having the latter external structure are known as distributed Bragg reflector (DBR) lasers.

In some applications, particularly coherent optical communications, it is important that the emitted radiation shows a narrow linewidth. This allows coherent detection systems, such as heterodyne or homodyne detection, to be used and much greater amounts of data to be transmitted as a consequence.

Fabry-Perot lasers have been found unsuitable, having linewidths of more than 100 MHz. It is known that DFB lasers can be fabricated having narrower emission linewidths than those of unmodified Fabry-Perot lasers, and that additional structures such as external cavities can result in narrowed emission linewidths.

However emission linewidth has tended to remain an unpredictable characteristic of different laser structures.

Considerable work has been done in trying to assess the factors which control linewidth in a laser. In the paper "Theory of the Linewidth of Semiconductor Lasers" by Charles H Henry, *IEEE Journal of Quantum Electronics*, QE-18 (2), February 1982 pp 259–264, a theory is presented which arrives at a broadening term $(1+\alpha^2)$, $\alpha$ being a fundamental parameter of the laser active material sometimes known as the linewidth enhancement factor.

As well as linewidth, $\alpha$ has been shown to affect the degree of transient wavelength chirping in directly modulated lasers.

There has been found, however, substantial ambiguity in the magnitude of $\alpha$ in long wavelength lasers. Values of $\alpha$ ranging from 2.2 to 6.6 have been measured or inferred. Further, a systematic dependence of $\alpha$ on laser length has been reported but unexplained. This latter effect is described in "Measurements of the Semiconductor Laser Linewidth Broadening Factor" by Henning and Collins, *Electronics Letters* 1983 19 pages 927–929.

In the paper "On the Linewidth Enhancement Factor in Semiconductor Injection Lasers", by K Vahala et al, *Applied Physics Letters* 42 (8), Apr. 15, 1983, it is predicted that in undoped Ga As, $\alpha$ will decrease with increasing excitation frequency.

Work has now been done, in making the present invention, by means of which practical embodiments of lasers may be designed which exploit a relationship between emission linewidth and operating wavelength. Significant improvements in the emission linewidths of lasers useful in optical communications for instance those having emission wavelengths of 1.3 and 1.55 $\mu$m, can be achieved.

It is an object of the present invention to provide semiconductor laser assemblies which have reduced emission linewidths.

According to the present invention there is provided a laser assembly which comprises a semiconductor laser structure and means for selecting the emission wavelength of the laser structure, the selected wavelength being shorter than the wavelength of maximum gain at the threshold current, λmax, by an amount such that the linewidth enhancement factor α at λmax, αmax, and α at the wavelength of the emitted radiation, $α_e$, are related in the manner $$α_e ≦ 0.9 α\text{max}$$

Preferably the selected wavelength is shorter than λmax by an amount such that αmax and $α_e$ are related in the manner $$α_e ≦ 0.8 α\text{max}$$

and even more preferably, such that $$α_e ≦ 0.7 α\text{max}$$

Advantageously the means for selecting the emission wavelength comprises a structure which in itself will encourage a narrow linewidth emission from the laser assembly, such as a distributed feedback grating or an external cavity.

More advantageously, the means for selecting the emission wavelength comprises a combination of structures which each in themselves encourage a narrow linewidth emission from the laser assembly, such as a distributed feedback grating in combination with an external cavity.

Preferably the arrangement is such that the selected emission wavelength lies in one of the ranges 1.2 to 1.35 μm and 1.48 to 1.65 μm. This is important where the laser assembly is to be used in generating radiation for transmission by means of silica optical fibres.

BRIEF DESCRIPTION OF THE DRAWINGS

Embodiments of the present invention will now be described, by way of example only, with reference to the accompanying Figures in which.

Figure 1:
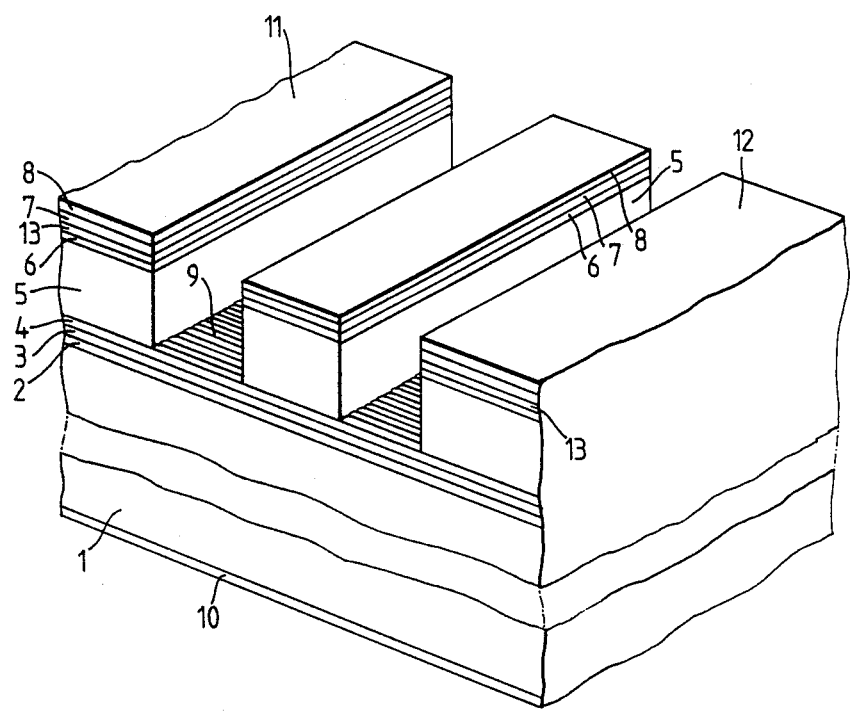
FIG. 1 shows a three-quarter view of a laser according to an embodiment of the present invention.

It should be noted that FIG. 1 is schematic and is not drawn to scale.

In the following description, and elsewhere in this specification, terms such as "on top of" and "underside" are used. These terms are used for convenience only and should not be taken to denote a particular orientation of any device unless it is clear from the context that a particular orientation is intended.

Referring to FIG. 1, the laser is of the type described in our European patent application No. 85301599.8, ie. a DFB ridge waveguide laser.

The substrate 1 is a heavily S-doped InP (n+-type) substrate approximately 100 μm thick. Onto the (100) face is grown a first confinement layer 2, 0.15 μm thick, of Te-doped (n-type) $Ga_xIn_{1-x}As_yP_{1-y}$, x and y being selected such that the material has a band gap wavelength equivalent of 1.15 μm as determined by photoluminescence. Onto the first confinement layer 2 is grown an active layer 3, 0.15 μm thick, of undoped $Ga_xIn_{1-x}As_yP_{1-y}$, x and y being selected such that the material has a band gap equivalent of 1.667 μm. Onto the active layer 3 is grown a second confinement layer 4, 0.2 μm thick, of the same material as the first confinement layer 2.

The second confinement layer 4 is corrugated to provide a distributed feedback grating 9 by chemical etching through an electron-beam-exposed mask in the manner described by Westbrook et al, *Electronics Letters* 1982 18 pages 863 to 865. The corrugations run in the (110) direction, comprising triangular grooves with (111) A side walls. The period of the grating 9 is 475 nm and the grooves are approximately 170 nm deep.

On top of the grating 9 lies the ridge of the ridge waveguide structure, comprising a layer 5 approximately 1.5 μm thick of Zn-doped (p-type) indium phosphide grown by atmospheric pressure, metal organic chemical vapour deposition (MOCVD) while maintaining the integrity of the gratings as previously described (European Patent Application No. 84 300240.3 and also Nelson et al, *Electronics Letter* 1983 19 pages 34 to 36). On top of the latter indium phosphide layer 5 is grown, also by MOCVD, a layer 6 approximately 0.1 μm thick of heavily Zn-doped (p+-type) ternary material of nominal composition $In_{0.53}Ga_{0.47}As$. Lastly electrical contact layers 7, 8 of titanium and gold respectively, each about 0.1 μm thick, are provided on the layer 6 of ternary material. A further contact layer 10 is provided on the underside of the substrate 1, by evaporation of tin and gold followed by alloying.

The ridge is about 6 μm wide and the laser as a whole is 300 μm long, having one cleaved end facet and one end facet damaged to reduce reflection.

To either side of the ridge lie further raised portions 11, 12 or semiconductor material, each separated from the ridge by a channel. These raised portions 11, 12 have a similar layer construction to the ridge but each has an extra layer 13 of silica below the contact layers 7, 8.

In use, the DFB ridge waveguide laser described above will emit radiation having a wavelength centred on 1.55 μm, and a linewidth of about 10 MHz at 10 mW output power. The band gap equivalent of the material of the active layer, as stated, is 1.667 μm. In a Fabry-Perot laser without a grating, this material would show a wavelength of maximum gain at the threshold current (λmax) of 1.61 μm. Therefore the DFB ridge waveguide structure emits radiation having a wavelength which is 60 nm less than the λmax of the material of the active layer.

Other laser structures may give a narrower emission linewidth than the one described above. For instance if the length of the laser as a whole were increased to 800 μm, the linewidth should be reduced to about 1 MHz at 10 mW output power. However in each case the laser will be benefitting to the same degree from operating at an emission wavelength of 1.55 μm, 60 nm below λmax at 1.61 μm, in accordance with the present invention.

The laser described above is designed to emit at one of the optimal wavelengths, 1.55 μm, for use with silica optical fibres. A laser designed to emit at the other optimal wavelength, 1.3 μm, has the following modifications:

(i) the quaternary material of the active layer has a composition selected such that its band gap equivalent wavelength is 1.452 μm (equivalent to 855 meV) λmax being 1.36 μm; and (ii) the grating comprises corrugations which have a period of 398 nm and are about 142 nm deep.

This laser structure, at a length of 300 μm, will again be operating at 60 nm below λmax at 1.36 μm, and its linewidth will again be of the order of 10 MHz at an output power of 10 mW. If the length of the laser is increased to 800 μm, its emission linewidth will drop to about 1 MHz at an output power of 10 mW.

In an alternative construction to the DFB lasers described above, an external cavity or a distributed Bragg reflector may be used to reduce α, and therefore narrow the emission linewidth of a laser, according to the present invention. Both structures can be used to select the emission wavelength of a laser. By using it to select an emission wavelength shorter than λmax, an external cavity or distributed Bragg reflector can be used to achieve the object of the invention.

By using a combination of structures which in themselves narrow the emission linewidth of a laser, and working at an emission wavelength less than λmax, narrower linewidths can be achieved than those quoted above. For instance, a DFB ridge waveguide laser equipped with a suitable external cavity may shown an emission linewidth at 10 mW output power of less than 100 KHz.

It should be noted that structures which can be used to select an emission wavelength for a laser can affect the emission linewidth independently of α. For instance, if an external cavity with a mirror is used, the linewidth may be significantly broadened if the round trip path for radiation in the cavity causes it to be out of phase with radiation oscillating within the laser.

Figure 2:
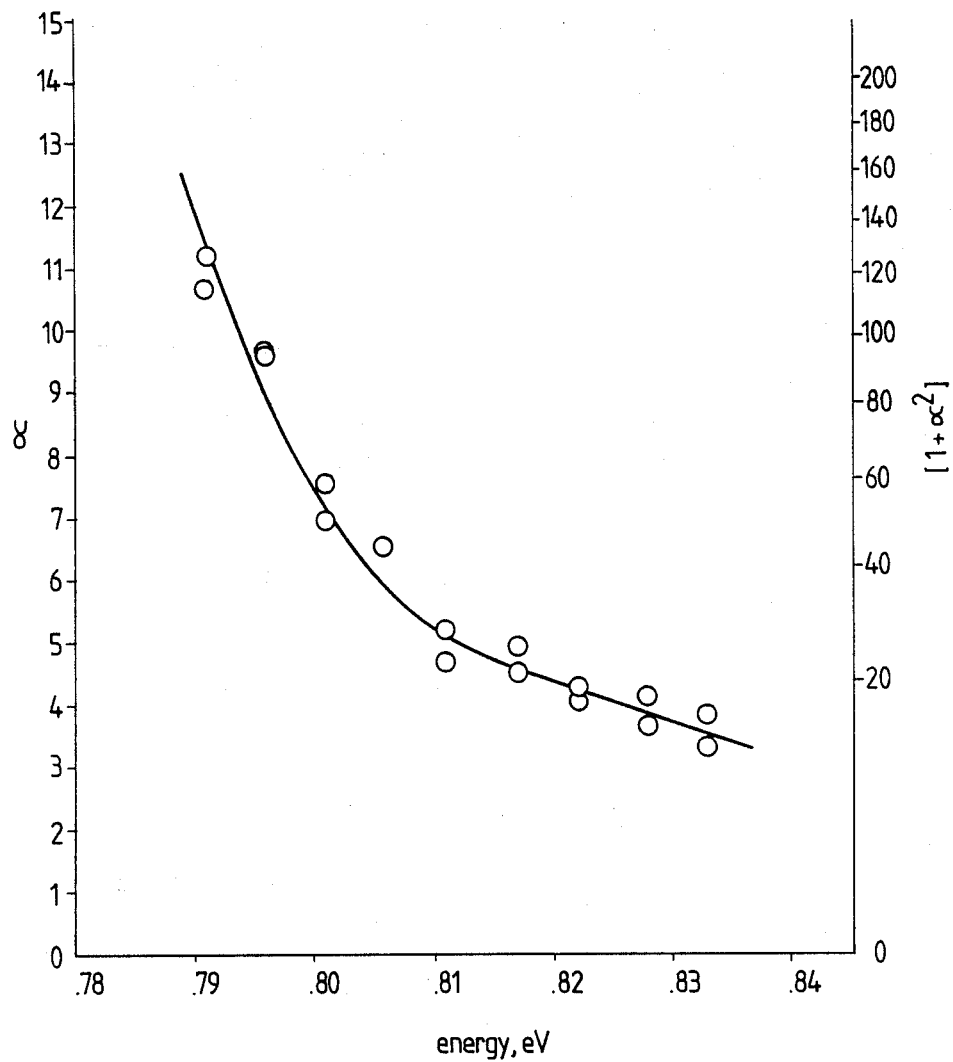
FIG. 2 shows in graph form the relationship between the linewidth enhancement factor α and photon energy in a laser.

It is possible to estimate α at different operating wavelengths for the same structure. Referring to FIG. 2, α has been determined from the Fabry-Perot resonances in the laser emission spectrum below threshold current by measuring the change in the mode gain G and the resonant wavelength λ with current I. G was determined by the method of Hakki and Paoli disclosed in "Gain Spectra in GaAs Double Heterostructure Injection Lasers", *Journal of Applied Physics* 1975 46 pages 1299–1306.

Writing the refractive index of the laser active region as $n' + jn''$ then α is defined as $$\alpha = \frac{dn'}{dn''} \quad (1)$$

Since both real and imaginary parts of the refractive index are functions of the injected carrier density N, α is more usually given as $$\alpha = \frac{4\pi}{\lambda} \frac{dn'/dN}{dg/dN} \quad (2)$$

where the material gain g is related to $n''$ through $n'' = \lambda g / 4\pi$ dG/dI and dλ/dI are related to dg/dn and dn'/dN through $$\frac{dG}{dI} = C \frac{dg/d\lambda}{dN \, dI} \quad (3)$$

$$\frac{d\lambda}{dI} = C \cdot \frac{\lambda}{n} \frac{dn'}{dN} \frac{dN}{dI}$$

where C is the mode confinement factor and $\bar{n}$ is the group refractive index given by $$\bar{n} = n' \left(1 - \frac{\lambda}{n'} \frac{dn'}{d\lambda}\right) \quad (5)$$

$\bar{n}$ was experimentally determined in the usual way from the Fabry-Perot mode spacing $\Delta\lambda_s$ using the relation $$\bar{n} = \frac{\lambda^2}{2L\Delta\lambda_s} \quad (6)$$

where L is the device length. Substitution of equations (3) and (4) into equation (2) yields $$\alpha = \frac{4\pi\bar{n}}{\lambda^2} \frac{d\lambda/dI}{dG/dI} \quad (7)$$

Measurements were performed on two nominally identical 190 μm long In Ga As P ridge waveguide lasers. The lasing wavelength for both was 1.53 μm (0.811 eV) and the threshold current was 32 mA. The laser temperature was maintained at 20° C.±0.05° C. using a thermo-electric cooler. All measurements were made using pulsed conditions (500 nsec pulses, 0.1% duty cycle) thus avoiding effects due to device heating.

The measured variation in α over the wavelength range λ=1.49 to 1.57 μm (0.791 to 0.833 eV) is shown in FIG. 2. The left hand vertical axis is α while the right hand axis is the linewidth broadening term $(1+\alpha^2)$ disclosed by Charles H Henry. The measured variation in α over the 42 meV range in photon energies is approximately α=3 to 11 which encompasses nearly all the previously reported measurements.

α can be seen to increase rapidly as the photon energy approaches the band gap energy, 0.791 eV. The curve illustrates the advantages that can be gained by operating a laser at a wavelength below λmax. At λmax, ie. at 0.811 eV, αmax=5.1. By operating the laser structure at a wavelength equivalent to 0.819 eV, α=0.9αmax. By further decreasing the wavelength at which the laser structure operates, for instance to wavelengths equivalent to 0.824 and 0.834 eV, α can be reduced to values of 0.8 αmax and 0.7 αmax respectively.

As mentioned above, the emission linewidth of a laser depends on many factors and the effect of a reduction in α can be heavily obscured, or even more than cancelled out, by other factors in the design or operation of a laser. For instance, operating temperature has a strong influence on linewidth, increasing temperature resulting in increased linewidth. In the description above, the figures for linewidth given relate to laser structures which are heat-stabilised in operation, by known techniques.

It is optimal, if the emission radiation has a wavelength which lies in the range 1.1 to 1.65 μm, to operate at a wavelength 40 to 80 nm, and particularly 60 nm, shorter than λmax for a particular laser structure. This gives a significant reduction in emission linewidth without increasing the threshold current of the laser too high.

The reduction in linewidth which can usefully be obtained by operating a laser structure at a wavelength below λmax is generally of the order of 50%.

I claim:

1. A laser assembly including a semiconductor laser structure, the improvement comprising means for selecting the emission wavelength of the laser structure, the selected wavelength being shorter than the wavelength of maximum gain at the threshold current, $\lambda max$, by an amount such that the linewidth enhancement factor $\alpha$ at $\lambda max$, $\alpha max$, and $\alpha$ at the wavelength of the emitted radiation, $\alpha_e$, are related in the manner $$\alpha_e \leq .9 \alpha max.$$

2. A laser assembly according to claim 1 wherein $\alpha max$ and $\alpha_e$ are related in the manner $$\alpha_e \leq 0.8 \alpha max.$$

3. A laser assembly according to claim 1 wherein $\alpha_{max}$ and $\alpha_e$ are related in the manner $$\alpha_e \leq 0.7 \alpha max.$$

4. A laser assembly according to any of the preceding claims wherein the means for selecting the emission wavelengths of the laser structure comprises a distributed feedback grating.

5. A laser assembly according to any one of claims 1–3 wherein the means for selecting the emission wavelength of the laser structure comprises a distributed feedback grating and an external cavity.

6. A laser assembly according to any one of claims 1–3, wherein the selected emission wavelength of the laser structure lies in one of the ranges 1.2 to 1.35 $\mu$m and 1.48 to 1.65 $\mu$m.

7. A laser assembly according to any one of claims 1–3, wherein the means for selecting the emission wavelength of the laser structure comprise an external cavity.

* * * * *